United States Patent [19]

Bülle et al.

[11] 4,303,733
[45] Dec. 1, 1981

[54] FILAMENT WITH CONDUCTIVE LAYERS

[75] Inventors: Wolfgang Bülle, Wuppertal; Hans G. Tilgner, Mulheim, both of Fed. Rep. of Germany

[73] Assignee: Akzona Incorporated, Asheville, N.C.

[21] Appl. No.: 113,667

[22] Filed: Jan. 21, 1980

[30] Foreign Application Priority Data

Jan. 24, 1979 [DE] Fed. Rep. of Germany ....... 2902545

[51] Int. Cl.³ .......................... B32B 1/08; B32B 27/02; B32B 27/20; B32B 33/00; H01B 7/00
[52] U.S. Cl. .............................. 428/367; 174/102 C; 174/126 CP; 361/303; 428/376; 428/380; 428/381; 428/389; 428/394; 428/395; 428/397; 428/398
[58] Field of Search ............... 428/367, 376, 380, 381, 428/389, 394, 395, 398, 397; 174/102 C, 126 CP; 361/303

[56] References Cited

U.S. PATENT DOCUMENTS

| 3,003,223 | 10/1961 | Breen . | |
|---|---|---|---|
| 3,397,085 | 8/1968 | Cariou et al. | 361/323 |
| 3,540,080 | 9/1967 | Goossens . | |
| 3,803,453 | 4/1974 | Hull . | |
| 3,931,446 | 1/1976 | Murayama et al. | |
| 4,045,949 | 9/1977 | Paton | 428/367 |
| 4,064,375 | 12/1977 | Russell et al. | |
| 4,089,034 | 5/1978 | Taylor et al. | |
| 4,139,936 | 2/1979 | Abrams et al. | 174/102 C |
| 4,188,651 | 2/1980 | Dornfeld et al. | 361/303 |
| 4,207,376 | 6/1980 | Nagayasu et al. | 428/373 |
| 4,216,264 | 8/1980 | Naruse et al. | 428/370 |

FOREIGN PATENT DOCUMENTS

| 858882 | 1/1978 | Belgium . |
| 2623930 | 12/1977 | Fed. Rep. of Germany . |
| 2742133 | 3/1978 | Fed. Rep. of Germany . |
| 816965 | 7/1959 | United Kingdom . |

Primary Examiner—James C. Cannon
Attorney, Agent, or Firm—Francis W. Young; Jack H. Hall

[57] ABSTRACT

A filament of synthetic polymers which, in its cross section over the entire length of the thread, comprises at least three layers, of which at least two layers are electrically conductive and at least one layer located between the conductive layers consists of an electrically insulating synthetic polymer.

10 Claims, 8 Drawing Figures

FILAMENT WITH CONDUCTIVE LAYERS

The invention refers to a filament of synthetic polymers.

It is known that a structure consisting of two electrically conductive plates insulated from one another by a dielectric displays a defined electrical capacitance and thus forms a condenser. Roll-type condensation of plastic film with metal foil coverings, or metal coverings vaporized directly onto the plastic film, are well known. Such films are wound and then form the condenser.

It is also known that piezoelectric plastic films provided with conductive coverings are eminently suited for electroacoustic transducers and have, meanwhile, stood up well in microphones, pickups and high frequency loudspeakers. Such electroacoustic transducers are e.g., described in Belgian Patent 858,882, German Offenlegungsschriften No. 2623930 and 2742133, as well as in U.S. Pat. No. 4,064,375.

Processing and winding of the films for use in condensers, as well as in electroacoustic transducers, is troublesome and requires great care. For use in miniature components, economic preparation and processing of the films is difficult. In addition, all care in production notwithstanding, one has to put up with wide deviations from the standard data.

It was the goal of the present invention to overcome these mentioned disadvantages and to make available materials that would further expand the possibilities of utilization.

This problem is solved by means of a filament of synthetic polymers, which is characterized by the fact that, in a section transverse to the longitudinal direction of the filament, it is made up of at least three layers, of which at least two layers are electrically conductive, and at least one layer located between the electrically conductive layers consists of an electrically insulating, synthetic polymer. Preferably, the electrically conductive layers are provided with electrical connections.

In one version of the invention, the filament consists of at least three layers parallel to one another, as shown schematically in FIG. 8. Preferably, however, the layers are arranged concentrically and the external, electrically conductive layer covers the entire circumference. A great variety of core-skin bicomponent filaments has already been made for the most varied purposes. Among others, core-skin bicomponent filaments with an electrically conductive core have already been prepared, such as are e.g., described in British Pat. No. 816,965, U.S. Pat. Nos. 3,003,223, and 3,803,453. The filament pursuant to the invention can be prepared by means of analogous spinning processes, or other processes, a great number of which has been described in the state of the art. It is, however, essential that the electrically conductive layers are produced thereby, or in a similar processing stage. For example, in order to improve the adhesion of electrodeposits, additional, thin intermediate layers of polymer/metal powder mixtures can be extruded during the spinning process, in which case, use is made of appropriate, known multicomponent spinning plates with several concentric, circular orifice slits, which are supplied with the different streams of melt. Suitable devices are described in U.S. Pat. No. 3,540,080.

Especially in those cases where the filament pursuant to the invention is to be provided with piezoelectric characteristics, it is preferable that when the core component is compressible, achieved either by utilizing hollow filaments or by selection of appropriate synthetic polymers, as for example, polyolefins with low molecular weight or polyethers. A suitable form of execution consists of using as core component an electrically conductive, highly viscous liquid with metal and/or carbon black and/or graphite particles dispersed therein. Suitable, highly viscous liquids are e.g., cis- and transpolyacetylene with relatively low molecular weight, which, if required, contain a small proportion of iodine or arsenic pentachloride.

An especially preferred version of the invention consists in the filament being a hollow filament made up of at least three layers in the filament cross section. Manufacture of the electrically conductive layer located in the interior of the hollow filament can be performed in such a way that a multicomponent, hollow filament spinning plate is used for the extruding of the hollow filament and an intermediate layer consisting of a polymer/metal powder mixture is co-extruded jointly with the insulating polymer. Through a tube passed through a spinning plate opening, a solution for the chemical deposition of copper or nickel is squirted into the hollow space of the filament at an adequate distance from the point of emergence of the freshly spun filament, so that, during the aftertreatment of the filament, the wall of the tubular hollow space is completely covered with the metal. If required, this layer of metal can, after dividing of the filament into suitable sections and replacement of the liquid in the hollow space with an electroplating bath, be reinforced with an additional metal coating by means of electrodeposition.

This electrodeposition can be performed simultaneously with the deposition of the electrically conductive external layer. For an improvement of adhesion, it is advantageous if a thin external layer of a polymer/metal powder mixture is also co-extruded on the outside. The filament pursuant to the invention is manufactured pursuant to technological methods known for the preparation of synthetic filaments. The filament diameters also correspond to the dimensions known from there, going from about 10 micron to about 3 mm. Preferably, however, the filament diameters are between 50 and 1000 micron. Typical filament diameters are 180, 250 and 450 micron. In the case of hollow fibers, the wall thickness in general amounts to 1/8 to 1/20 of the filament diameter. Here, wall thicknesses of 10 to 100 micron are typical.

The filament pursuant to the invention has to be made up of at least three layers, but, where this appears to be appropriate and advantageous, it may also have additional layers. In many cases, the filament is prepared with intermediate layers to increase the adhesion of the electrically conductive layers. In general, these intermediate layers contain metal powder for an increase in the conductivity of the intermediate layer, which conductivity is, however, too low to permit considering the intermediate layer already as contact layer. In many cases, it is advantageous to provide the filament on the outside with an insulating protective layer; whereas the other layers, with the exception of the contact layers, are in general formed during filament formation, the protective layer is applied only after completion of the rest of the filament.

The electrically insulating layer between the contact layers can itself consist of several insulating layers, e.g., of different polymers. By means of such a configuration of the object of the invention, characteristics of the polymers can to a greater extent take effect in combination, such as a good piezoelectricity of the one polymer and the mechanical characteristics of another polymer.

The filament pursuant to the invention can be processed on the usual textile machines (winding, twisting, etc.). For example, woven and knitted fabrics and pieces may simultaneously be decorative covering and functional part, e.g., a sound panel.

Special versions of the invention result from the filament pursuant to the invention deviating from a circular cross section. Examples of such cross sections of hollow filaments deviating from a circular shape are shown in FIGS. 3 to 5.

The polymers suitable for the filament pursuant to the invention are all those that can be shaped from the melt and/or solutions and display a high dielectric constant. It is e.g. possible to use polyamides, including the aromatic polyamides, polyesters, in particular polyalkylene terephthalates, polycarbonates, polyvinylidene fluoride, polyurethanes, or polyphosphazene as synthetic polymer for the insulating intermediate layer.

Advantageously, in particular with a view to the release of piezoelectric properties, the electrically insulating, synthetic polymer should be at least partly crystallizable. Molecular orientation of the polymer should be possible, not only with a view to the piezoelectric characteristics, but molecular orientation considerably improves the mechanical characteristics of the filament pursuant to the invention.

The fact that the preponderant number of the polymers listed above as examples, in particular if they are at least partly crystallizable, will acquire permanent piezoelectric characteristics under the influence of a direct voltage to an elevated temperature is known. A pressure applied to the polymer creates electrical impulses, which are picked up by the conductive layers and passed along. The application of alternating voltages to the conductive layers causes the polymer to vibrate.

Methods, pursuant to which piezoelectric characteristics are imparted to polymers, have already been described and also applied to polymer films on a larger scale. Here, one can e.g., mention U.S. Pat. Nos. 3,931,446, and 4,089,034.

The filament pursuant to the invention, if it has suitable dimensions, can be used as condenser, provided the inner and outer electrically conductive layers are always provided with connectors.

The capacitance of the condenser results from the selected dimensions and can be calculated according to the formula $$C = 0.0885 \epsilon A/d$$

wherein C is the capacitance of the condenser in picofarads (pF), (pF = $10^{12}$ farads); $\epsilon$ is the relative dielectric constant of the synthetic polymer forming the insulating intermediate layer, and d the thickness of this intermediate layer in cm, while A is the surface of the yarn section under consideration for the condenser, in cm².

In the case of a core-skin filament with an electrically conductive core, this core can be made with an exactly determined, specific conductivity by mixing carbon black and/or metal powder with suitable polymers.

As a result, such a condenser will then simultaneously display a defined electrical resistance at the internal contact point, so that condensers are formed which, with great savings of space, can directly be installed as RC components in electronic circuits.

The filament pursuant to the invention can be processed on textile machines without any limitations, which in turn produces numerous additional advantageous possibilities.

The filament pursuant to the invention is in particular excellently suited for components with low capacitance, especially with small dimensions, as are desirable for high and highest demands.

Pursuant to the invention, the invented filament with piezoelectric characteristics can be used in electroacoustic transducers.

Here, flat membranes have already been found suitable, but result in numerous difficulties during installation. It is advantageous to use hollow fibers pursuant to the invention for this purpose, which can be used in the manufacture of microphones, loudspeakers, telephone capsules and headphones with constant and good technical data, such as transmission range, frequency response curve and sensitivity. Transducer systems with the filament pursuant to the invention have above all a low distortion factor and can also be used for low audio frequencies. Hollow fibers with a cross section deviating from the circular shape, as are shown in FIGS. 3 to 5, are especially suitable for pickup systems.

The filament pursuant to the invention, if it has been provided with piezoelectric characteristics by polarization in a direct voltage field can, in keeping with the invention, also be used for piezoelectric sensors of mechanical stress. For example, the cross section shapes shown in FIGS. 6 and 7 are suitable therefor. Corresponding filaments pursuant to the invention can e.g., be woven or knitted into fabrics for test probes. The filament pursuant to the invention can also be used as a sensor in fencing arms in order to obtain electrical impulses for the indication of hits. It is, furthermore, possible to manufacture sensor switches with the filament pursuant to the invention.

As hollow fiber with exactly circular cross sections, the filament pursuant to the invention is extremely well suited as flexible hollow conductor for the transmission of the highest frequencies, since, due to the spinning technology, it can be manufactured with such small transverse dimensions, that even in the case of highest frequencies, the radius of the hollow space cross section remains small with respect to the wavelength. The hollow fiber pursuant to the invention can, without difficulties, be made with a radius of the hollow space cross section of 30 microns, up to 800 microns.

These small dimensions of the hollow cross section also permit utilization of the filament pursuant to the invention for tank circuits in the range of highest frequencies (up to a high gigahertz range).

BRIEF DESCRIPTION OF THE DRAWINGS

FIG. 1 shows a multicomponent filament of the core-skin type with an electrically conductive core component and an electrically conductive external layer covering the entire circumference.

FIG. 2 shows a hollow filament displaying exactly circular cross sections. For the sake of greater clarity, the dimensions have intentionally not been drawn to scale.

FIGS. 3 to 5 show hollow filament cross sections—likewise not drawn according to scale—with cross-sectional shapes deviating from the circular.

FIG. 6 shows a hollow filament with circular cross section, where external boundary and the boundary of the hollow space are excentric. This results in regularly varying wall thicknesses which, in the case of electro-acoustic transducers, leads to special influences on radiation and frequency response.

FIG. 7 shows the shape of a hollow fiber cross section deviating from a circle, where the wall thickness is not constant along the circumference.

FIG. 8 shows a filament in which the internal and external conductive layers are each located at the filament circumference, whereby the electrically conductive layers cover only part of the circumference.

Figure 1:
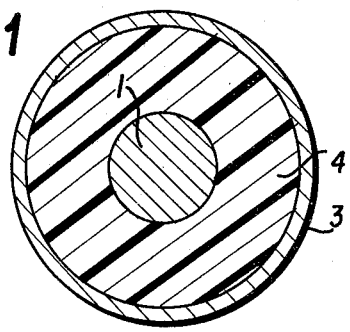
FIGS. 1 to 8 show filament cross sections as may, for example, be found in the filaments pursuant to the invention. In each case, 1 is the inner, electrically conductive layer; if hollow fibers are shown, 2 is the hollow space, while 3 is the external conductive layer. The intermediate layer of an electrically insulating, synthetic polymer is indicated by 4.
Figure 2:
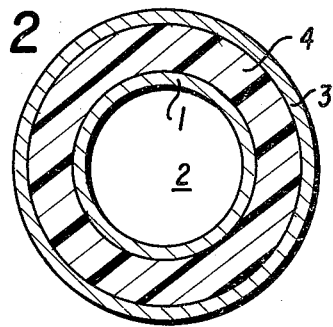
Figure 3:
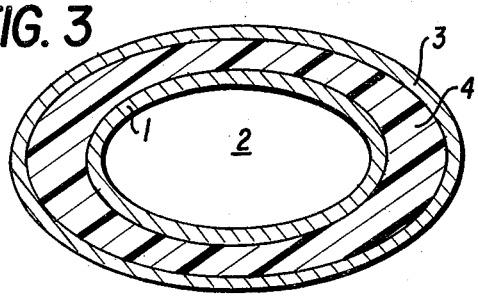
Figure 4:
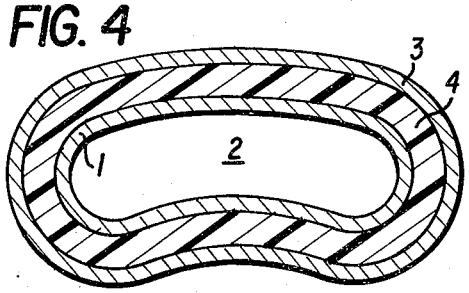
Figure 5:
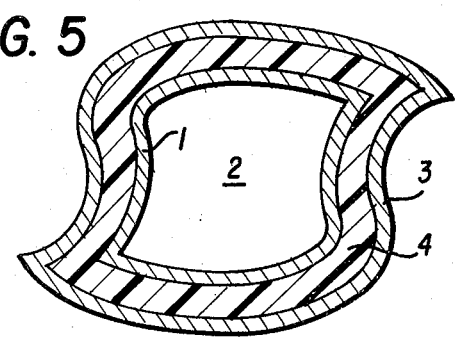
Figure 6:
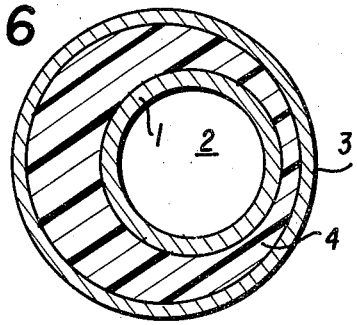
Figure 7:
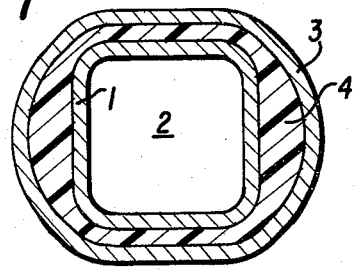
Figure 8:
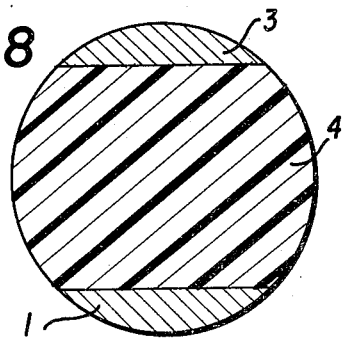

We claim:

1. A filament from synthetic polymers adapted for use in an electrical circuit, having a cross section comprising at least three layers, at least two of which are electrically conductive, and wherein at least one of said layers is located between said conductive layers and comprises an electrically insulating, synthetic polymer, and wherein the electrically conductive layers are provided with electrical connections.

2. A filament from synthetic polymers, having a cross section comprising at least three layers, at least two of which are electrically conductive, and wherein at least one of said layers is located between said conductive layers and comprises an electrically insulating, synthetic polymer, one of said electrically conductive layers surrounds said other layers and extends over the entire circumference of said filament.

3. The filament of claim 1 or 2, wherein said filament is a multi-component filament of the core-skin type, with an electrically conductive core component and an electrically conductive surface.

4. The filament of claim 3, wherein said core component is compressible.

5. The filament of claim 3, wherein said core component is an electrically conductive, highly viscous liquid having metal and/or carbon black and/or graphite particles dispersed therein.

6. The filament of claims 1 or 2, wherein said filament is a hollow filament, made up of at least three layers in the filament cross section.

7. The filament of claims 1 or 2, wherein said electrically insulating, synthetic polymer is at least partially crystallizable.

8. The filament of claim 7, wherein said electrically insulating, synthetic polymer is molecularly oriented.

9. The filament of claims 1 or 2, wherein said filament displays piezoelectric characteristics.

10. The filament of claim 6, having a diameter of from 50 to 1000 microns, a hollow space with a cross-sectional radius of from 30–800 microns, and wall thickness of from 10 to 100 microns.

* * * * *